United States Patent

Yao et al.

[11] Patent Number: 6,143,664
[45] Date of Patent: Nov. 7, 2000

[54] METHOD OF PLANARIZING A STRUCTURE HAVING AN INTERPOLY LAYER

[75] Inventors: Liang-Gi Yao, Taipei; Chung-Ju Lee; Yue-Feng Chen, both of Hsinchu; Wei-Ray Lin, Yi Lan; Yeur-Luen Tu, Taipei, all of Taiwan

[73] Assignee: Vanguard International Semiconductor Corporation, Hsinchu, Taiwan

[21] Appl. No.: 08/928,205

[22] Filed: Sep. 12, 1997

[51] Int. Cl.[7] .................................................. H01L 21/00
[52] U.S. Cl. .......................... 438/692; 438/697; 438/723; 438/738; 438/743; 216/38
[58] Field of Search ..................... 438/691, 692, 438/697, 745, 723, 738, 743; 216/88, 38, 67

[56] References Cited

U.S. PATENT DOCUMENTS 5,702,980 12/1997 Yu et al. .................................. 438/692
5,858,860 1/1999 Shim et al. .......................... 438/692 X
5,858,870 1/1999 Zheng et al. ........................ 438/692 X

*Primary Examiner*—William Powell
*Attorney, Agent, or Firm*—Christensen O'Connor Johnson Kindness PLLC

[57] ABSTRACT

A method of planarizing a structure having an interpoly layer is disclosed. The method includes forming an undoped silica glass layer on at least a polysilicon region formed on a semiconductor substrate. Next, a spin-on-glass layer is formed over the undoped silica glass layer. Finally, the spin-on-glass layer is etched back, thereby planarizing the structure having the interpoly layer.

20 Claims, 2 Drawing Sheets

METHOD OF PLANARIZING A STRUCTURE HAVING AN INTERPOLY LAYER

TECHNICAL FIELD OF THE INVENTION

The present invention relates to planarization, and more particularly, to a method of planarizing a structure having an interpoly layer using an undoped silica glass layer.

BACKGROUND OF THE INVENTION

The silicon wafers used for very large scale integration (VLSI) circuits are ideally flat. However, after many process steps, such as growth or deposition of various insulating and conductive layers, a nonplanar structure is usually formed. For example, the gate oxide of a metal oxide semiconductor (MOS) transistor is only 100–250 angstroms thick, whereas the field oxide may be 10000 angstroms thick. The nonplanarity primarily results in two problems. The first is the difficulty of maintaining step coverage without breaks in the continuity of fine lines. The second is the inability to lithographically transfer fine-line patterns to the wafer.

More specifically, lithography technique has steadily shifted towards shorter wavelengths, such as the deep ultraviolet (DUV), in order to reduce the minimum feature size. Unfortunately, decreasing the wavelength results in reducing the depth of focus (DOF), which is an important parameter because the surface of the microcircuit has a nonplanar topographical surface. Therefore, the number of photolithography steps required to cover the microcircuit is increased, thereby increasing the time required to fabricate the microcircuit.

Techniques for planarization are, therefore, become more important. Borophosphosilicate glass (BPSG) deposited by using ozone-tetraethylorthosilane (TEOS) or low pressure TEOS (LPTEOS) has been conventionally used as an interpoly oxide (IPO) layer in order to planarize interpoly layers. Unfortunately, the BPSG layer usually results in an autodoping effect, in which the boron ions contained in the BPSG diffuse down to the underlying polysilicon, thereby altering the concentration profile therein. Furthermore, the temperature in densifying the BPSG layer thus deposited is very high, usually higher than 850° C., resulting in a high thermal budget.

SUMMARY OF THE INVENTION

In accordance with the present invention, a method of planarizing a semiconductor structure having an interpoly layer is disclosed. The method comprises: forming an undoped silica glass layer on at least a polysilicon region formed on a semiconductor substrate, said undoped silica glass layer being formed by pyrolytic oxidation of ozone-tetraethylorthosilane, said undoped silica glass layer serving as the interpoly layer; densifying said undoped silica glass layer; forming a spin-on-glass layer over said undoped silica glass layer; and etching back said spin-on-glass layer, thereby planarizing the structure having the interpoly layer.

DESCRIPTION OF THE PREFERRED EMBODIMENT

Figure 1:
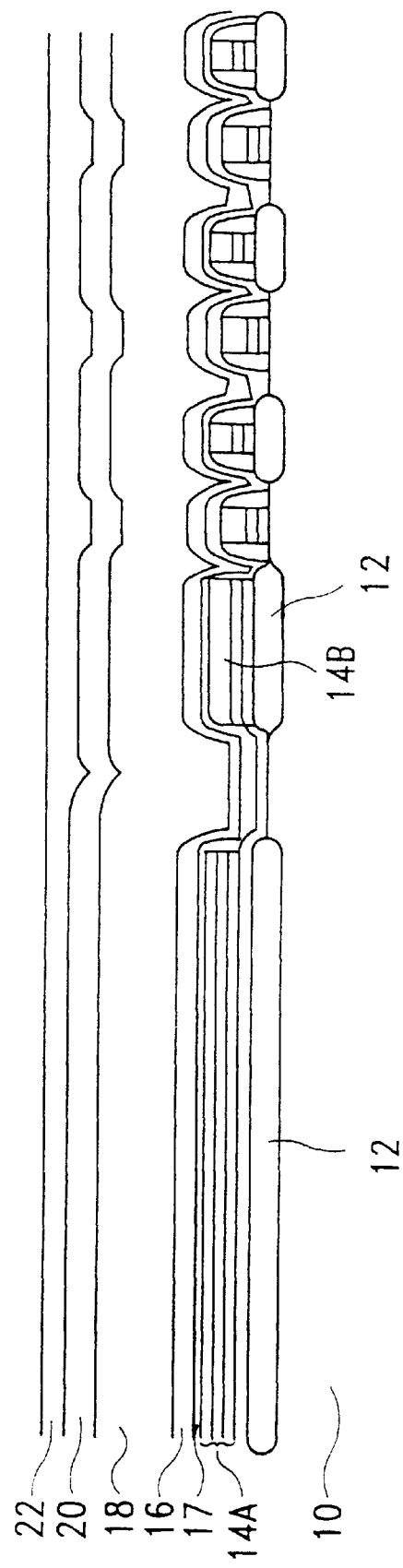
FIG. 1 is a cross section of a wafer substrate illustrating various stages of the method according to the present invention.

Depicted in FIG. 1 is a cross section of a silicon substrate 10 having a field oxide (FOX) region 12, which is conventionally formed in the substrate 10. On the substrate 10 is a polysilicon region 14A, such as often used as a poly-gate. It is appreciated that other parts, such as the source and drain regions, of a metal oxide semiconductor (MOS) transistor are not shown in the FIGURE for clarity. Another polysilicon region 14B, which is connected to a word line, is conventionally formed on the field oxide region 12.

An oxynitride ($SiO_xN_y$) layer 17 by LPTEOS or plasma enhanced chemical vapor deposition (PECVD) method is optionally deposited over the substrate 10, the field oxide region 12, and polysilicon regions 14A and 14B to provide a moisture barrier layer for the subsequent layer.

Next, a thin linear layer 16 such as a low pressure sub-atmospheric chemical vapor deposited (LPSACVD) layer is formed on the oxynitride layer 17, in order to eliminate the surface sensitivity of polysilicon. In this embodiment, the thin linear layer 16 is deposited to a thickness of about 1000 angstroms.

After the linear layer 16 is formed, an $N_2$-plasma treatment may be optionally performed to improve the quality or surface sensitivity of the linear layer 16 thus formed. Thereafter, an undoped silica glass (USG) layer 18 having a thickness of about 2000–8000 angstroms is conformally formed on the surface of the linear layer 16 to serve as an interpoly layer. A conventional sub-atmospheric chemical vapor deposition (SACVD) process is used for depositing this USG layer 18 in the embodiment according to the present invention. The USG layer 18 is formed by the pyrolytic oxidation of ozone-tetraethylorthosilane (TEOS) carried by SACVD at 350–450° C., and proceeds as follows:

$$Si(C_2H_5O)_4 + 12O_3 = SiO_2 + 8CO_2 + 10H_2O + 4O_2$$

It is noted that the use of the USG layer 18 substantially eliminates the autodoping problem encountered in the conventionally used BPSG layer.

A cap layer 20 such as PECVD layer may be optionally formed on the surface of the USG layer 18 when the thickness of the USG layer 18 is too thick (for example, more than 5000 angstroms). This cap layer 20 helps to prevent the USG layer 18 from cracking.

Next, a high temperature treatment is performed to density the USG layer 18. In this embodiment, the temperature range is about 700–850° C. for a time period of about 5–120 minutes. It is noted that the temperature used in the present invention is much lower than that conventionally used in densifying a BPSG layer, which is usually higher than 850° C. Therefore, this results in a lower thermal budget in fabricating VLSI circuits. It is appreciated that this densifying step may be delayed until a subsequent spin-on glass (SOG) step is complete.

Over the USG layer 18 and/or cap layer 20, a conventional SOG process is then utilized to form an SOG layer 22 having a flat top surface. The normal thickness of the SOG layer 22 is about 1000–5000 angstroms. The forming of the SOG layer 22 applies conventional photoresist spining techniques by spinning SOG materials, such as polysiloxane polymers, over the cap layer 20 once or twice, when necessary. Low temperature curing or baking (about 100–250° C.) may be used to inhibit the cracking expected for a thick (usually thicker than 3000 angstroms) SOG layer 22.

Figure 2:
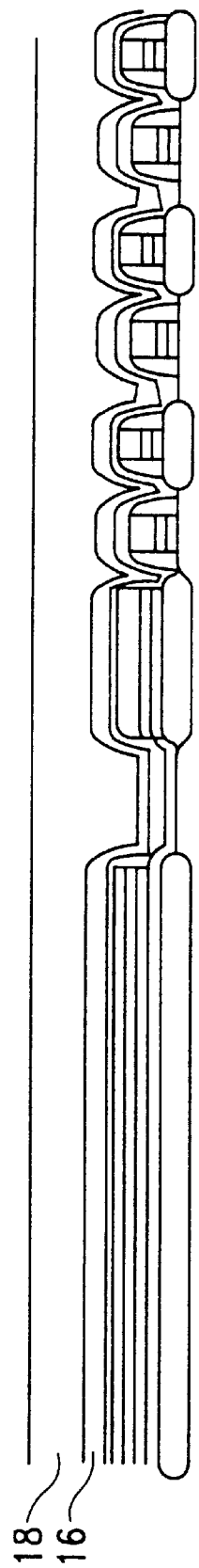
FIG. 2 shows a cross section after the spin-on-glass layer is etched back.

To complete the invention, the SOG layer 22, the cap layer 20 and portion of the USG layer 18 are sacrificially etched back until a flat surface of the USG layer 18 is achieved, resulting in the structure shown in FIG. 2. A partial thickness, about 4000–8000 angstroms in this embodiment, of the SOG layer 22 is thus consumed. In this embodiment, a conventional plasma etch, such as reactive ion etch with etchant $CF_4$, $CHF_3$, $NF_3$, $C_2F_6$ is used, so that an etch rate selectivity of SOG/USG is in the range of about 0.7–2.0.

Although specific embodiments have been illustrated and described, it will be obvious to those skilled in the art that various modifications may be made without departing from the spirit which is intended to be limited solely by the appended claims.

What is claimed is:

1. A method of planarizing a semiconductor structure having an interpoly layer, the method comprising:
   forming an undoped silica glass layer on at least a polysilicon region formed on a semiconductor substrate, said undoped silica glass layer serving as the interpoly layer;
   forming a spin-on-glass layer over said undoped silica glass layer; and
   etching back said spin-on-glass layer until a flat surface of said undoped silica glass layer is achieved, thereby planarizing the structure having the interpoly layer.

2. The method according to claim 1, further comprising forming a linear layer on the polysilicon region and the substrate before forming said undoped silica glass layer.

3. The method according to claim 2, wherein said linear layer is formed by low pressure sub-atmospheric chemical vapor deposition.

4. The method according to claim 2, further comprising forming an oxynitride layer before forming said linear layer.

5. The method according to claim 2, further comprising an $N_2$-plasma treatment before or after forming said linear layer.

6. The method according to claim 1, wherein said undoped silica glass layer is formed by pyrolytic oxidation of ozone-tetraethylorthosilane.

7. The method according to claim 6, wherein said undoped silica glass layer is formed by sub-atmospheric chemical vapor deposition.

8. The method according to claim 1, further comprising forming a cap layer on said undoped silica glass layer.

9. The method according to claim 1, further comprising densifying said undoped silica glass layer before forming said spin-on-glass layer.

10. The method according to claim 9, wherein said undoped silica glass layer is densified at about 700–850° C.

11. The method according to claim 1, further comprising densifying said undoped silica glass layer after forming said spin-on-glass layer.

12. The method according to claim 11, wherein said undoped silica glass layer is densified at about 700–850° C.

13. The method according to claim 1, further comprising baking said spin-on-glass layer.

14. The method according to claim 1, wherein said spin-on-glass layer is etched back by a plasma process.

15. A method of planarizing a semiconductor structure having an interpoly layer, the method comprising:
    forming an undoped silica glass layer on at least a polysilicon region formed on a semiconductor substrate, said undoped silica glass layer being formed by pyrolytic oxidation of ozone-tetraethylorthosilane, said undoped silica glass layer serving as the interpoly layer;
    densifying said undoped silica glass layer;
    forming a spin-on-glass layer over said undoped silica glass layer; and
    etching back said spin-on-glass layer until a flat surface of said undoped silica glass layer is achieved, thereby planarizing the structure having the interpoly layer.

16. The method according to claim 15, wherein said undoped silica glass layer is formed by a sub-atmospheric chemical vapor deposition.

17. The method according to claim 15, wherein said undoped silica glass layer is densified at about 700–850° C.

18. A method of planarizing a structure having an interpoly layer, the method comprising:
    forming an undoped silica glass layer on at least a polysilicon region formed on a semiconductor substrate, said undoped silica glass layer being formed by pyrolytic oxidation of ozone-tetraethylorthosilane, said undoped silica glass layer serving as the interpoly layer;
    forming a spin-on-glass layer over said undoped silica glass layer;
    densifying said undoped silica glass layer; and
    etching back said spin-on-glass layer until a flat surface of said undoped silica glass layer is achieved, thereby planarizing the structure having the interpoly layer.

19. The method according to claim 18, wherein said undoped silica glass layer is formed by a sub-atmospheric chemical vapor deposition.

20. The method according to claim 18, wherein said undoped silica glass layer is densified at about 700–850° C.

* * * * *